US007288928B2

(12) United States Patent
Shapiro

(10) Patent No.: US 7,288,928 B2
(45) Date of Patent: Oct. 30, 2007

(54) SOLENOIDAL HALL EFFECTS CURRENT SENSOR

(75) Inventor: Jonathan S. Shapiro, Greenwich, CT (US)

(73) Assignee: Greenwich Instruments Co., Inc., Greenwich, CT (US)

(*) Notice: Subject to any disclaimer, the term of this patent is extended or adjusted under 35 U.S.C. 154(b) by 4 days.

(21) Appl. No.: 11/168,899

(22) Filed: Jun. 27, 2005

(65) Prior Publication Data

US 2006/0290340 A1 Dec. 28, 2006

(51) Int. Cl.
*G01R 15/20* (2006.01)

(52) U.S. Cl. ................................................ 324/117 H

(58) Field of Classification Search ..................... None
See application file for complete search history.

(56) References Cited

U.S. PATENT DOCUMENTS

| | | | | |
|---|---|---|---|---|
| 3,878,455 A | | 4/1975 | Ochmann | |
| 3,963,931 A | | 6/1976 | Shapiro | |
| 4,163,208 A | * | 7/1979 | Merz | 340/447 |
| 4,177,406 A | | 12/1979 | Hermeyer et al. | |
| 4,223,228 A | | 9/1980 | Kaplan | |
| 4,573,184 A | | 2/1986 | Tanaka et al. | |
| 4,673,884 A | | 6/1987 | Geus | |
| 4,768,215 A | * | 8/1988 | Kiwaki et al. | 378/101 |
| 5,835,554 A | | 11/1998 | Suzuki et al. | |
| 6,310,472 B1 | * | 10/2001 | Chass | 324/207.2 |
| 6,323,634 B1 | * | 11/2001 | Nakagawa et al. | 324/117 R |
| 6,715,198 B2 | * | 4/2004 | Kawakami | 29/595 |
| 6,984,989 B2 | * | 1/2006 | Kudo et al. | 324/529 |
| 2004/0095137 A1 | * | 5/2004 | Kwun et al. | 324/240 |
| 2004/0260372 A1 | * | 12/2004 | Canfield et al. | 607/116 |
| 2005/0099184 A1 | * | 5/2005 | Gianzero et al. | 324/342 |
| 2006/0119342 A1 | * | 6/2006 | Teulings et al. | 324/117 H |

* cited by examiner

*Primary Examiner*—Vinh Nguyen
*Assistant Examiner*—Richard Isla-Rodas
(74) *Attorney, Agent, or Firm*—Grimes & Battersby, LLP

(57) ABSTRACT

A device for measuring anode tube current or filament current in an X-ray tube, comprising a coil of wire wrapped around an insulating tube to generate a solenoidal magnetic field, one or more pieces of magnetic material and insulating material located within the tube (which magnetic elements may have their electrical potential stabilized by a resistive voltage divider), and a Hall Effect current sensor (HECS) located at the far end of the tube and insulated from the magnetic material. The output of the Hall Effects sensor is connected to an amplifier circuit, and a secondary coil of wire is used to capture the high frequency component of the magnetic signal. The secondary coil is connected to a current amplifier circuit which is followed by a high pass filter to only provide components above the cross over frequency of the hall sensor. The two signals are combined with an amplifier to provide a broad band signal that may be viewed by a current amplifier.

12 Claims, 8 Drawing Sheets

OUTPUT IS STORED VALVE
OSC
F/F
T/H 1
T/H 2
OR
O.S.1 signal out
R25
R26
Zero held
Timing &
analog storage
Trigger
v ref
V+
V−
23
24
KV
Signal
(from Hall Sensor)
From Divider
128
130
36
38
40
32
34
42

Digital Auto Zero

106
Capacitor Design
Copper foil mf-5 108
glass tube mf-4 110
HV resistor SSX78 98
mf-5 foil
epoxy to glass
0.5
3.0"
0.5 OD
108
110
98
Solder pigtail
(mf-5)
Copper foil
.002"
2.5"
2"

(22) Hall Sensor

SOLENOIDAL HALL EFFECTS CURRENT SENSOR

BACKGROUND OF THE INVENTION

1. Field of the Invention

The present invention relates generally to a solenoidal Hall Effects current sensor and more particularly to such a current sensor capable of calibrating X-ray generators and other devices that operate at high voltage ranges, and even more particularly to such a current sensor that enables the measurement of anode tube current and X-ray tube voltage as well as filament current.

2. Description of the Prior Art

The Dynalyzer systems, originally designed by Shapiro, Pellegrino, et al. at Machlett Laboratories, in Stamford, Conn., a division of the Raytheon Company, have been the standard devices for calibrating X-ray systems since their introduction in 1976. There have been relatively few improvements or changes made other than those necessitated by the termination of many semiconductor components. Optical sensing would be subject to possible negative effects of the oil from leakage into the optical cavities, so the Dynalyzer was insulated using SF6 (sulphur hexafluoride gas).

Another instrument, the Inspec 100 and 200, which were distributed by Greenwich Instrument use various optical sensing means. The Inspec 100 uses a large number of LEDs which were matched together to temperature stabilize them and produce a linear light output versus current for each of three ranges. The Inspec 200 used LEDs in the transmitter, and a feedback scheme where the current required to produce the light was the feedback element. A similar design was used in the GiCi 4000R, which was similar in operation to the Inspec 200.

Radcal Corporation, in Monrovia, Calif., introduced a torroidal Hall Effect current sensor using commercially available components, such as those manufactured by Ohio Semitronics. The filment circuit of the Dynalyzer has similarly used a Hall Effect current sensor since the 1970s, using a single turn of heavy wire and significant additional plastic insulation. The Dynalyzer IIIUV manufactured by Radcal, uses a torroidal Hall Effect sensor with multiple turns of wire to sense the anode current, and is insulated with SF6 gas at 30 psig. Several patents have issued which use torroidal Hall Effect sensor for measurement of X-ray current, including U.S. Pat. No. 6,545,457, which issued to Goto, et al. on Apr. 8, 2003 for "Current detector utilizing hall effect"; U.S. Pat. No. 6,545,456, which issued to Radosovich, et al. on Apr. 8, 2003 for "Hall effect current sensor package for sensing electrical current in an electrical conductor"; U.S. Pat. No. 6,252,389, which issued to Baba, et al. on Jun. 26, 2001 for "Current detector having magnetic core for concentrating a magnetic flux near a hall-effect sensor, and power switch apparatus incorporating same"; U.S. Pat. No. 4,823,075, which issued to Alley on Apr. 18, 1989 for "Current sensor using hall-effect device with feedback."

Other devices for measuring or adjusting current in, imaging or otherwise monitoring X-ray devices are disclosed in U.S. Pat. No. 5,835,554, which issued to Suzuki, et al. on Nov. 10, 1998 for "X-ray imaging apparatus and x-ray generation detector for activating the same"; U.S. Pat. No. 4,768,215, which issued to Kiwaki, et al. on Aug. 30, 1988 for "X-ray generator with current measuring device"; U.S. Pat. No. 4,673,884, which issued to Geus on Jun. 16, 1987 for "Circuit for measuring the anode current in an X-ray tube"; U.S. Pat. No. 4,573,184, which issued to Tanaka, et al. on Feb. 25, 1986 for "Heating circuit for a filament of an X-ray tube"; U.S. Pat. No. 4,223,228, which issued to Kaplan on Sep. 16, 1980 for "Dental x-ray aligning system"; U.S. Pat. No. 4,177,406, which issued to Hermeyer, et al. on Dec. 4, 1979 for "Circuit for adjusting tube anode current in an X-ray generator"; and U.S. Pat. No. 3,878,455, which issued to Ochmann on May 15, 1975 for "Circuit arrangement for measuring the filament emission current of a cathode-ray or X-ray tube."

As will be appreciated, none of these prior patents even address the problem faced by applicant let alone offer the solution proposed herein.

SUMMARY OF THE INVENTION

Against the foregoing background, it is a primary object of the present invention to provide a solenoidal Hall Effects current sensor for calibrating X-ray systems.

It is another object of the present invention to provide such a current sensor that allows for the measurement of the anode tube current and X-ray tube voltage to ensure the safety of the X-ray system and to certify the proper operation of such system.

It is still another object of the present invention to provide such a current sensor that enables the measurement of filament current necessary to provide safe installation of an X-ray tub and to prevent damage to the equipment during set up.

It is but another object of the present invention to provide such a current sensor that may be used in other high voltage applications.

It is yet another object of the present invention to provide such a current sensor that allows the construction of compact oil filled voltage dividers.

It is still another object of the present invention to provide such a current sensor that is relatively inexpensive to manufacture and maintain.

It is another object of the present invention to provide such a current sensor that is relatively simple to operate.

It is another object of the present invention to provide such a current sensor that utilizes a Hall Effect torroidal sensor but is relatively easy to use in confined spaces.

It is still yet another object of the present invention to provide such a current sensor that can easily fit into an oil-filled voltage divider tank without increasing the size of the product.

It is another object of the present invention to provide such a current sensor which can readily be incorporated into a voltage divider currently commercially available, incorporated into a new structure, or retrofitted into existing equipment of similar configuration.

It is but another object of the present invention to provide such a current sensor which may also include an electronic circuit capable of compensating for drift due to thermal and magnetic factors.

It is still another object of the present invention to provide such a current sensor uses an auto-zero scheme that triggers from the high voltage waveform or other source, including a threshold of the current signal itself.

It is another object of the present invention to provide such a current sensor and auto-zero circuit capable of storing in its electronic memory the status of the offset several milliseconds prior to the start of a trigger signal.

To the accomplishments of the foregoing objects and advantages, the present invention, in brief summary, comprises a device for measuring anode tube current or filament current in an X-ray tube, comprising a coil of wire wrapped around an insulating tube to generate a solenoidal magnetic field, one or more pieces of magnetic material and insulating material located within the tube (which magnetic elements may have their electrical potential stabilized by a resistive voltage divider), and a Hall Effect current sensor (HECS) located at the far end of the tube and insulated from the magnetic material. The output of the Hall Effects sensor is connected to an amplifier circuit, and a secondary coil of wire is used to capture the high frequency component of the magnetic signal. The secondary coil is connected to a current amplifier circuit which is followed by a high pass filter to only provide components above the cross over frequency of the hall sensor. The two signals are combined with an amplifier to provide a broad band signal that may be viewed by a current amplifier.

BRIEF DESCRIPTION OF THE DRAWINGS

The foregoing and still other objects and advantages of the present invention will be more apparent from the detailed explanation of the preferred embodiments of the invention in connection with the accompanying drawings, wherein.

BRIEF DESCRIPTION OF THE PREFERRED EMBODIMENTS

Figure 1:
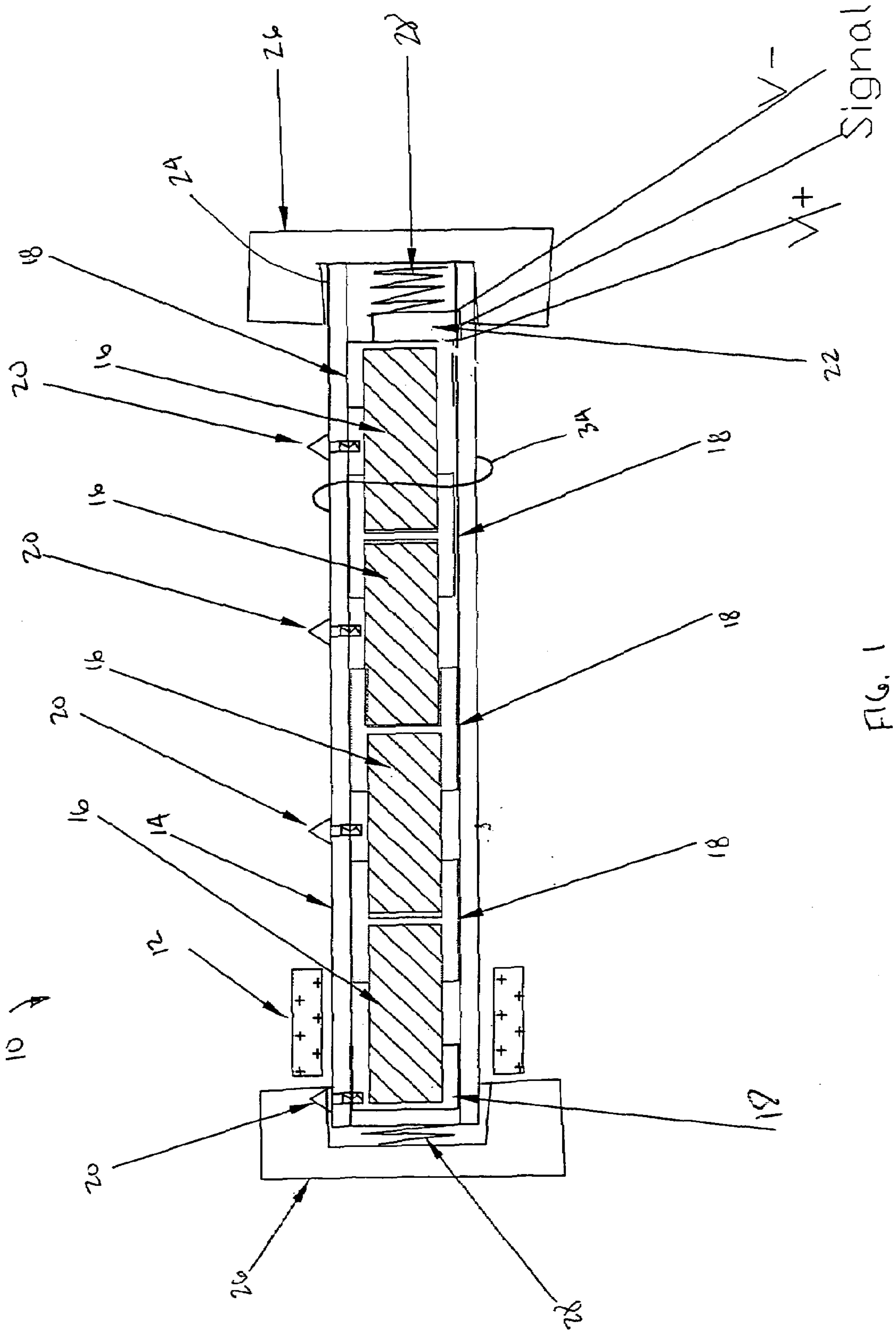
FIG. 1 is a schematic illustration of the solenoidal Hall Effects current sensor of the present invention.

Referring to the drawings and, in particular, to FIG. 1 thereof, the solenoidal Hall Effects current sensor of the present invention is provided and is referred to generally by reference numeral 10. The sensor 10 comprises a coil of wire 12 wrapped around an insulating tube 14. In the preferred embodiment, approximately 200 turns of wire are ideal for the coil of wire 12, and the insulating tube 14 is composed of a plastic such as PVC, CPVC, Teflon® or Delrin®. Tubes 14 of various diameters are contemplated, although ideally a tube 14 having an inner diameter of between ¾" and ⅝" and an outer diameter of between ⅞" and 1¼ are preferred. Situated within the insulating tube 14 are four pieces of magnetic material 16 and five pieces of insulating material 18. The insulating material 18 in the preferred embodiment are cup-shaped members having a diameter of 0.470 inches and are provided to contain the magnetic material 16 and provide resistance to high voltage flashover. In the preferred embodiment the magnetic material 16 is composed of a ferrous substance. Also provided are four contacts 20 for the magnetic material 16, which in the preferred embodiment are screws with soft metallic tips.

A Hall Effect magnetic sensor 22 is provided at one end 24 of the insulating tube 14, which sensor 22 is insulated from the magnetic material 16. In the preferred embodiment the sensor 22 is placed within an aluminum container or foil to shield it from electric fields. The ends 24 of the insulating tube 14 may be threaded, in which event end caps 26 may be provided to cover said ends 24, and retaining springs 28 may further be provided to keep the magnetic material 16, insulating material 18 and sensor 22 in contact with each other.

Figure 4:
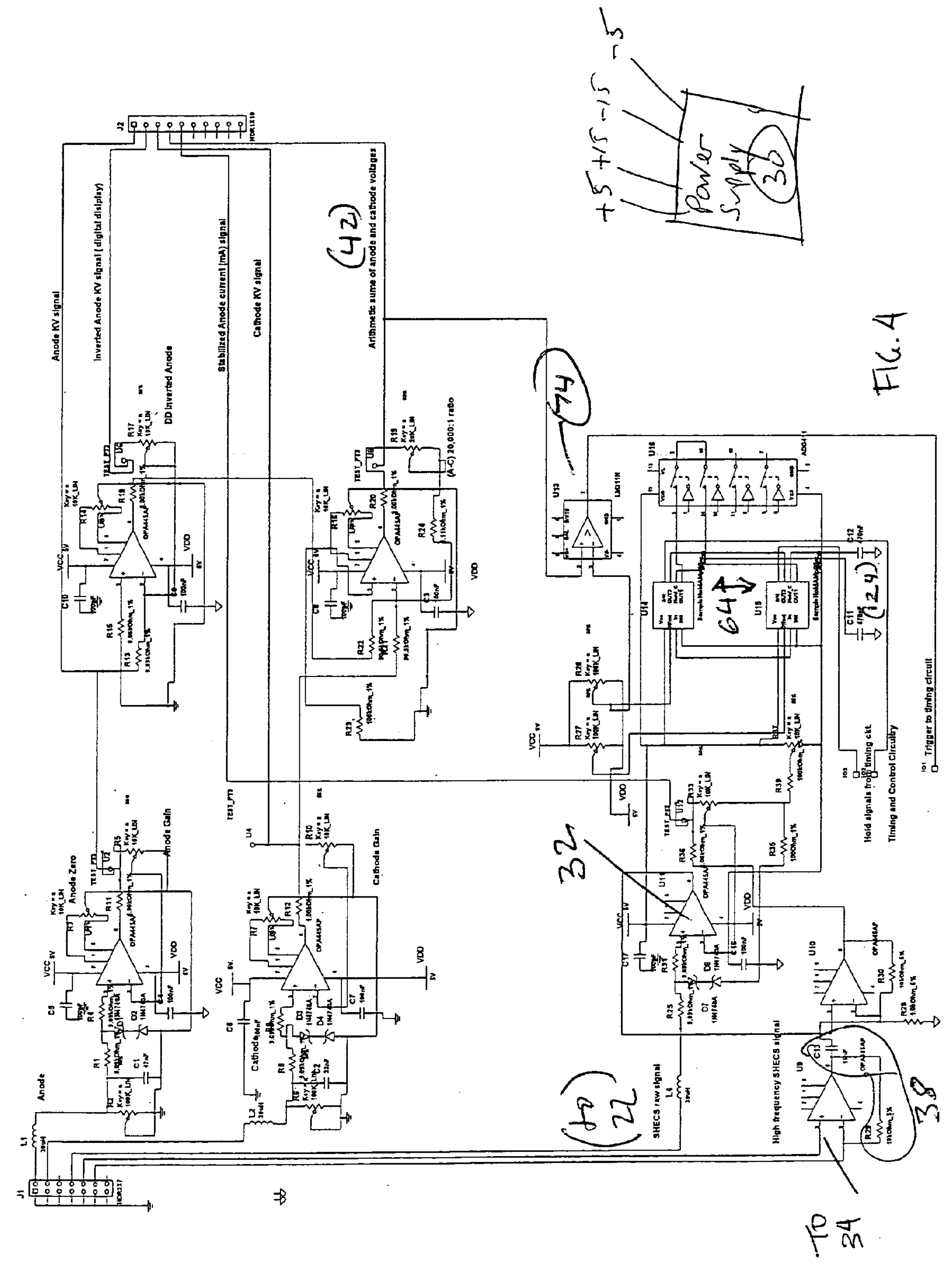
FIG. 4 is an electrical diagram showing the signal processor for an X-ray calibration system of the present invention.

A bi-polar power supply 30, as shown in FIG. 4, is provided to power the sensor 22, which power supply 30 in the preferred embodiment is + and −5 (Vs) volts for the sensor 22 being used. The power supply 30 also powers additional elements of the system, including the amplifiers for signal conditioning as well as the logic for zero stabilization.

The sensor 22 is electrically connected to an amplifier circuit 32, as shown in FIG. 4, which can be a conventional inverting integrated circuit. A secondary coil of wire 34 is utilized to capture the high frequency component of the magnetic signal, which secondary coil 34 is connected to a current amplifier circuit 35 which is followed by a high pass filter so as to only provide components above the cross-over frequency of the Hall Effects sensor 22. The two signals are combined with an amplifier 32 to provide a broad band signal which must be viewed by a current amplifier. As a voltage, this broad band signal would be proportional to the first derivative of the magnetic flux.

Figure 2:
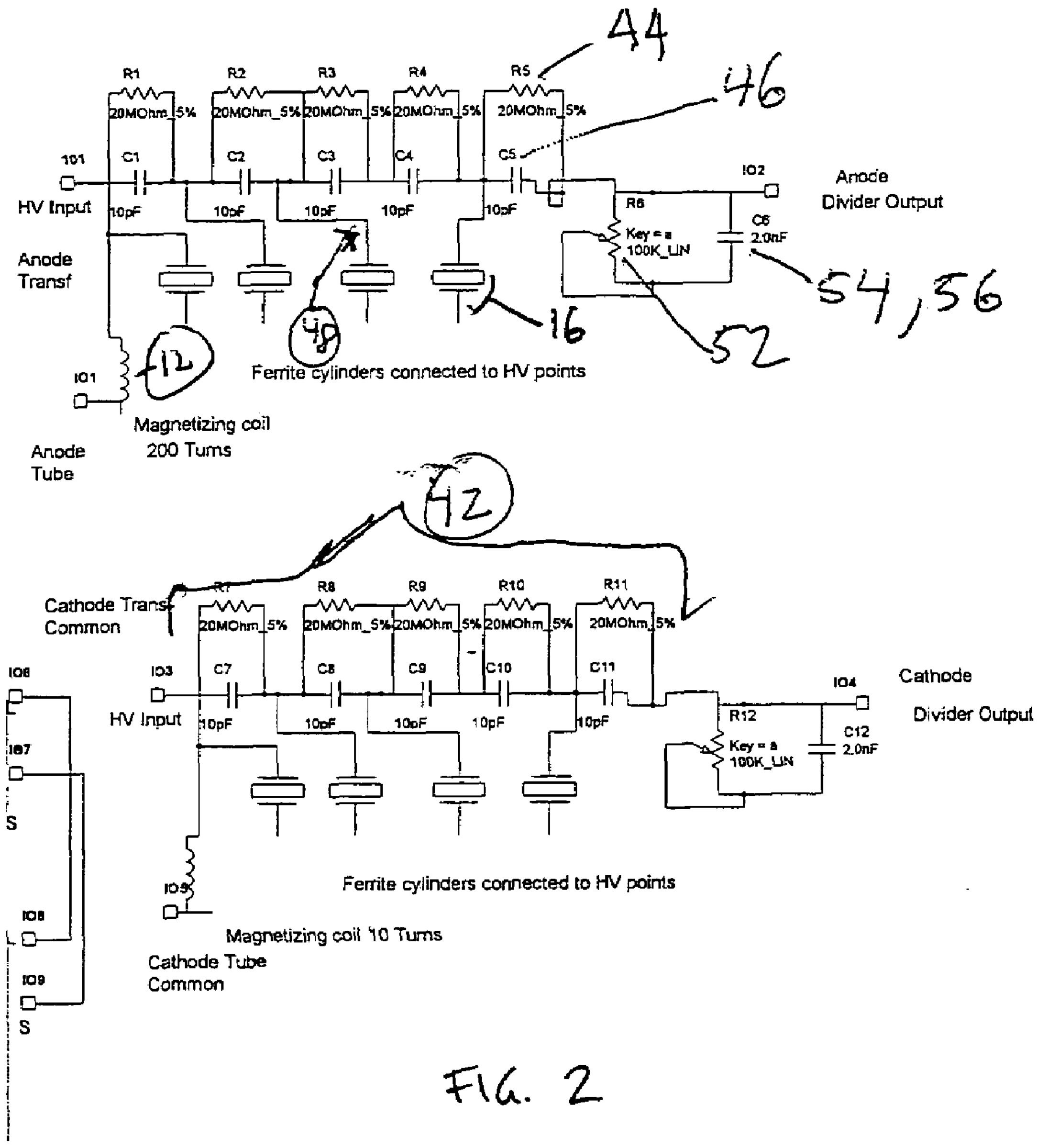
FIG. 2 is a schematic illustration of the voltage divider utilized in the present invention.

Illustrated in FIG. 2 is a schematic showing a voltage divider 42 to be used with the solenoidal Hall Effects current sensor 10 of the present invention. The voltage divider 42 comprises 5 high voltage resistors 44 and 5 high voltage capacitors 46. The magnetic material 16 is electrically connected to sections of the voltage divider 42 by means of retaining screws 48 and conductive wire 50. The voltage divider 42 is calibrated by R comp 52, and its frequency is compensated by C comp 54, specifically, when RC=R comp×C comp. In detail C comp 52 is switched from a bank of binary related capacitors 56, preferably 4 to 8 in number. Alternatively, it would be possible to provide a fixed capacitor and vary the RC factor with a variable R, which would then require an amplifier stage with an additional gain adjustment. Examples of the switch capacitor method are the Machlett HV-1 voltage divider and the GiCi 2000 voltage divider. The variable resistance and fixed capacitor method is used in the Dynalyzer II and successive models. It should be appreciated that the high voltage resistor network does not have to be used for measurement—it can be used solely to stabilize the potential differences between the sections of magnetic material 16.

It should also be appreciated that the number of sections of the voltage divider 42 may be varied—the number of sections herein provided was used inasmuch as it is desirable to keep the voltage stress between the various sections of magnetic material 16 to be less than 20,000 volts, and the insulating material 18 between sections to be in the order of 0.050 inch thick. The insulating material 18 allows for centering of the magnetic material 16 in the insulating tube 14. In the preferred embodiment, the insulating material 18 is 0.630 inches in outer diameter and 0.500 inches in inner diameter, and the separating web is approximately 0.050 inches thick.

In operation, when an electric current flows through the coil of wire 12, it generates a magnetic field. The magnetic field may be increased by increasing the number turns to the coil 12. For example, for measurement of tube 14 anode currents in the order of 10 mA to 2 amps, a coil with 200 turns of wire may be used. For measurement of the filament current (3-10 amperes) in the cathode, a coil with 10 turns generates sufficient magnetic field to produce an accurate low noise signal.

The current turns produce a magnetic field in the magnetic material 16 which goes through the four sections, with some leakage. The reduced field reaches the Hall Effect sensor 22. An example of such a sensor is made by Honeywell. This sensor has a 500 Hz frequency response. The secondary coil 34 will detect the flux as well, but is not limited in its frequency response to such a low value. By amplifying it with the current amplifier 36, it will replicate the form of the current applied. The high pass filter 38 allows this signal to be added to the Hall Effect sensor 22 signal, and the combined signal will have both DC, low and high frequency components which may be viewed by an oscilloscope or analyzed by a digital display such as the Dynalyzer III or Inspec 201 digital displays. The Hall Effects sensor 22 signal is adjusted to proper amplitude by the amplifier circuit 36, which contains a gain and zero adjustment. The capacitors 46 in the voltage divider 42 are chosen such that high voltage will have no effect in changing their capacitance. For example, polyester film and Mylar are devoid of significant voltage effects, while ceramic capacitors are poor choices in that they have significant voltage and temperature coefficients.

In order to automatically compensate for drift in the circuit, which may come from static magnetic forces as well as residual magnetism in the magnetic cores, an auto zero circuit 60 is advisable.

Figure 3:
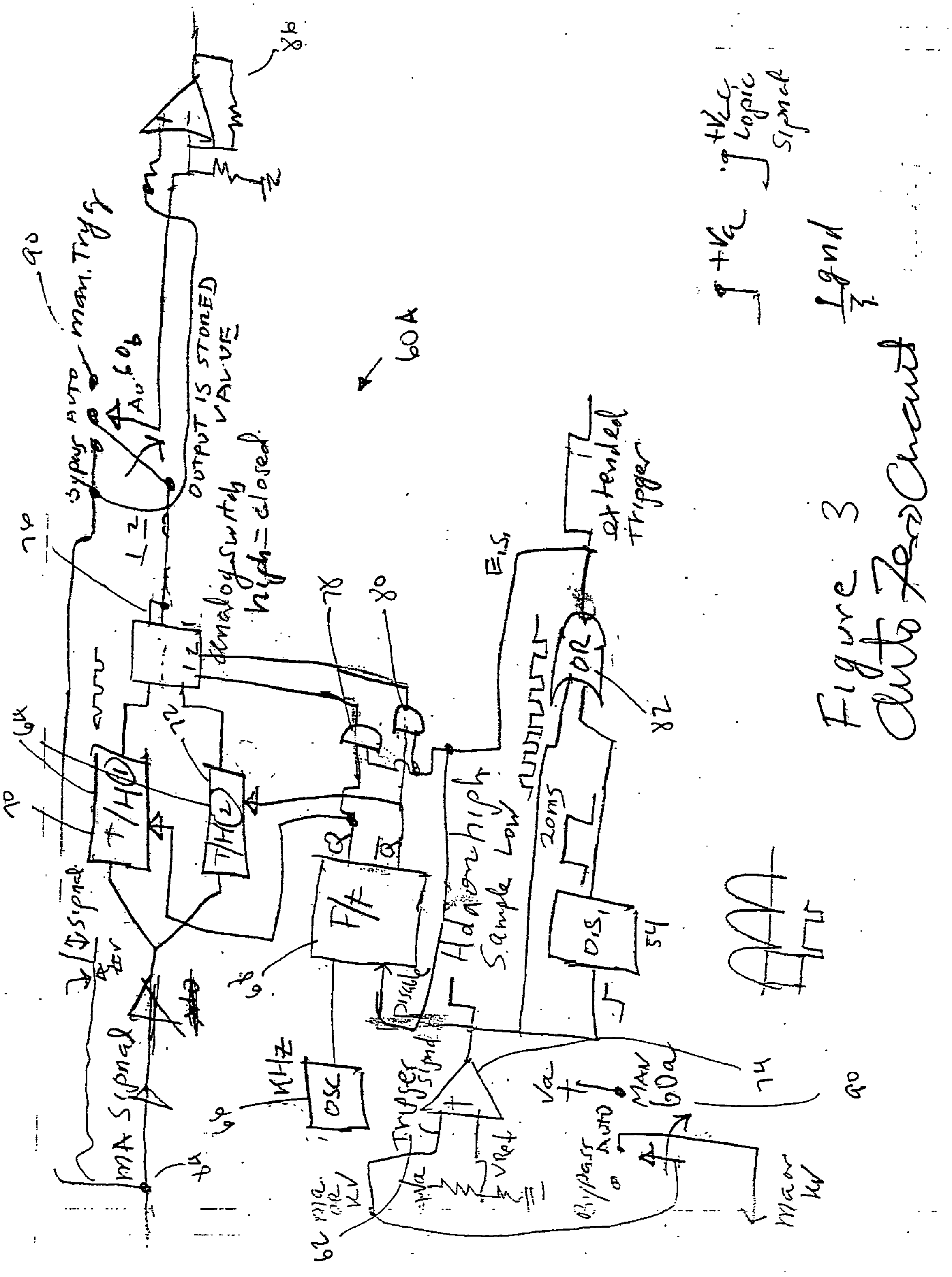
FIG. 3 is a schematic illustration showing the auto zero circuit utilized in the present invention.

Several embodiments are contemplated. As shown in FIG. 3, the auto zero circuit 60A comprises a trigger means 62 that operates to sense the value of the high voltage pulse in the voltage divider 42, and if it has increased past a fixed amount, for example 5 kV, will generate a trigger signal. This signal is passed through two track and hold circuits 64, which in the preferred embodiment are analog circuits capable of storing a signal in a capacitor. An oscillator 66 is provided to trigger a flip-flop 68 at approximately 2 millisecond intervals when the system is in idle. The Q and Q-not from the flip-flop 68 are directed to a pair of T/H units 70, 72 which "store" the value of the input voltage when the signal is high (i.e., where "high"=1 (true)). When an exposure is made, comparators 74 go high, which disables the operation of the flip-flop 68, leaving it in its last state, thereby resulting in one stored value and one value that was going to be stored. An analog switch 76 is used to select the stored value when it receives a trigger signal from AND gates 78, 80 by disabling the toggle action of the flip-flop 68 at this time, and by the extended trigger pulse. Additional circuitry is provided to assure that if the trigger signal momentarily drops out in a chain of exposures, the trigger signal remains constant. Every time a trigger pulse is made, a one shot pulse of approximately 100 millisecond duration is combined in an OR gate 82 with the trigger signal, thereby resulting in a combined signal being high 20 millisecond after the repeat of a trigger pulse. In a system powered by 60 Hz single phase power, there may be breaks in the trigger every 8.33 millisecond, or 10 millisecond in a 50 Hz system. The output from a milliamp sensor 84 is combined with the offset signal provided by amplifier 86, where the input from the offset signal is subtracted from the milliamp signal, the resulting signal which may be viewed by a scope or meter. If desired, the auto zero circuit 60 may be disabled, or manually triggered with a switch 90.

Figure 5:
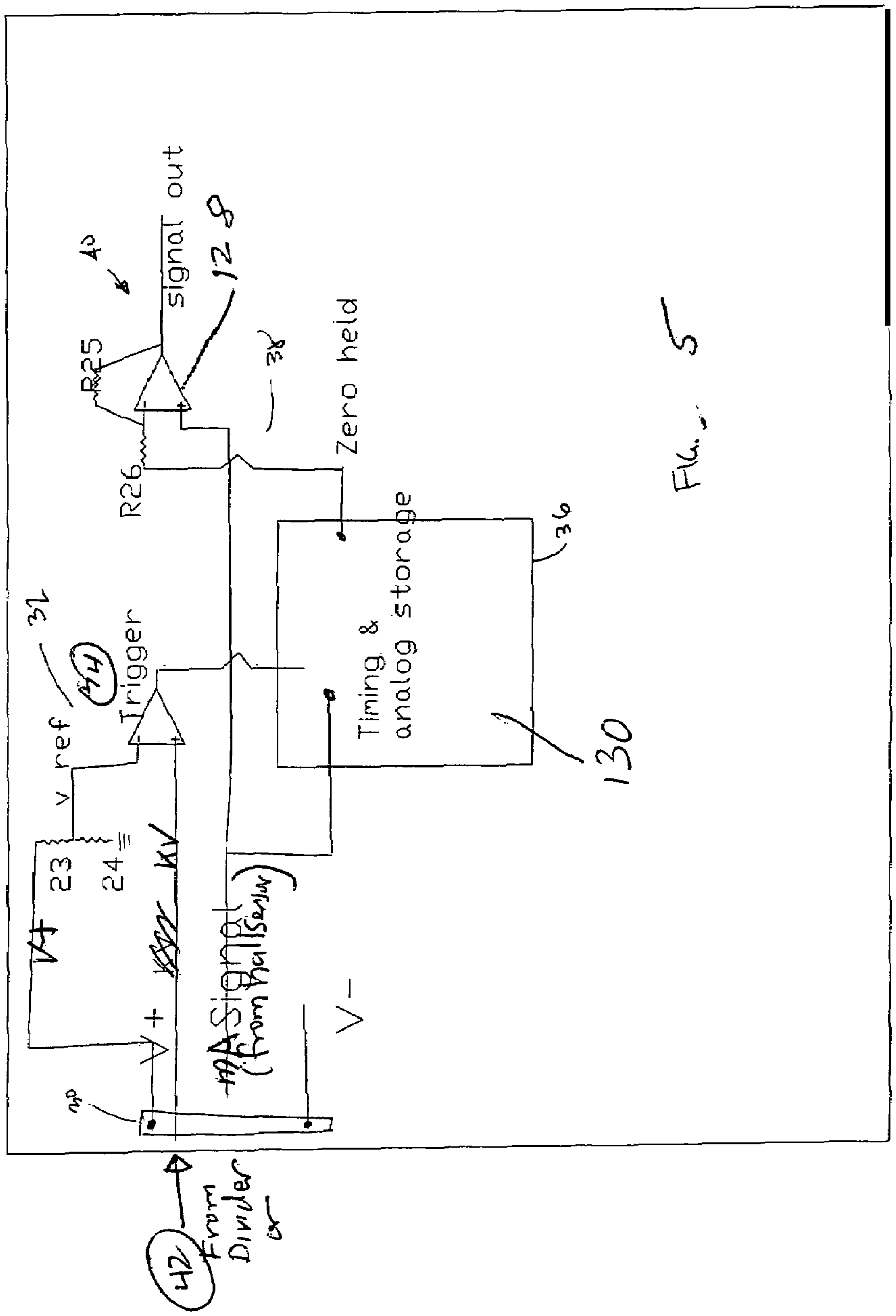
FIG. 5 is an electrical diagram of the solenoidal Hall Effects current sensor of FIG. 1.
Figure 6:
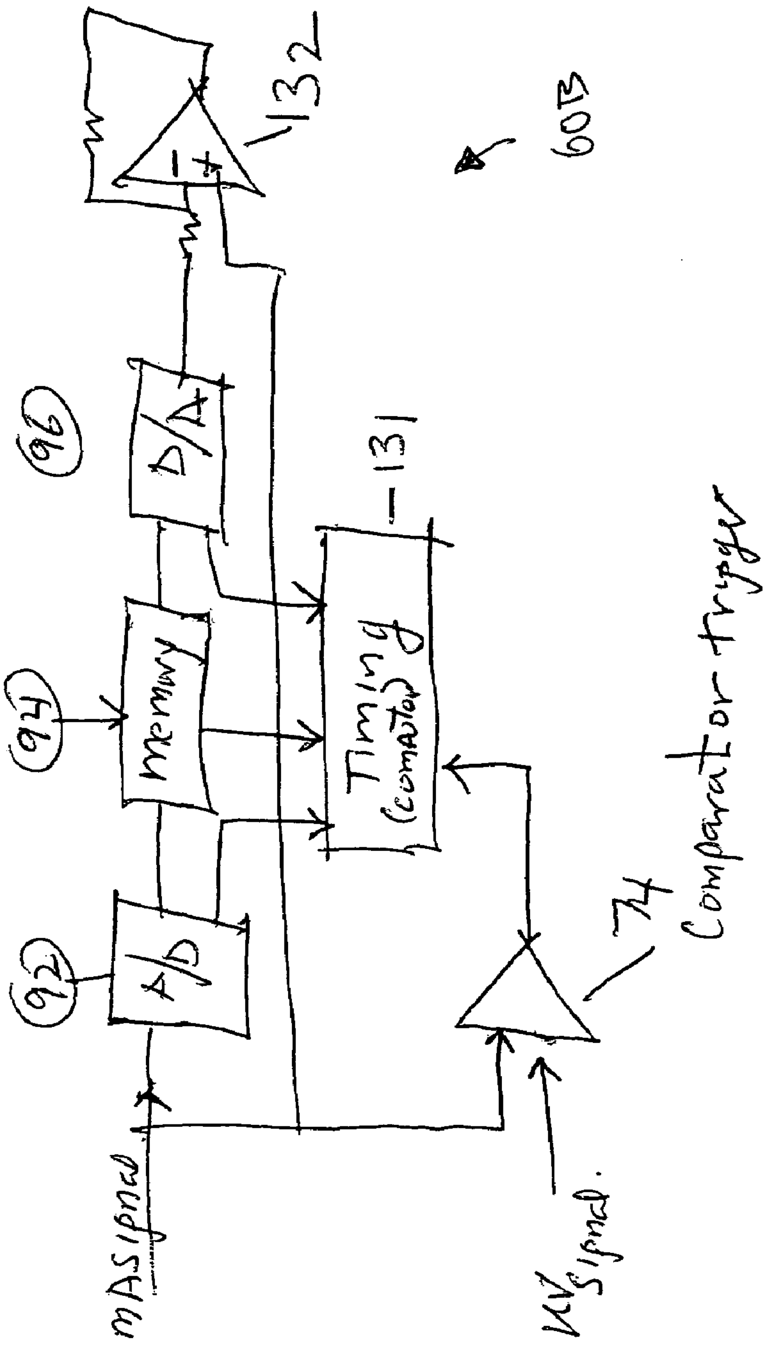
FIG. 6 is an electrical diagram of one embodiment of the digital auto zero circuit as used in the present invention.

The auto zero circuit 60B illustrated in FIG. 5A is required because the milliamp sensors 84 used in the instant device to achieve the large dynamic ranges required all have very sensitive electronics that drift. In operation, the auto zero circuit 60B stops the drift by holding the "zero" value before an exposure is needed. As illustrated in FIG. 5, using an A/D converter 92 and digital memory 94 to store successive values of the offset, and a D/A converter 96 to convert it back, a zero can be established during the exposure. If, for example several 8 bit voltage values were stored for a 100 mV offset, and they were clocked into a register 98 and stored every 8 mS for example, then when an exposure is detected, the stored value of offset would be saved in digital memory 94 and fed back through a D/A converter 96 to restore the base line.

A comparator 74 would detect an exposure via an edge. The saved value would be held until the exposure ended, and the data converted. The offset would be detected before the final output stage, and would always correct it, but would hold the correction during the exposure. It would react during the first mS of the exposure.

It should be appreciated that these auto zero circuits 60A and 60B may be used with several types of X-ray current sensors, or any other type of sensor to which there is a secondary trigger channel for comparison. For example, it may be used with the optical current sensor design of U.S. Pat. No. 3,963,931, which issued to Shapiro on Jun. 15, 1976.

In another embodiment of the present invention, as illustrated in FIG. 4, an entire X-ray calibration system 102 is provided having a voltage divider 42, a current sensor 10 for the anode current as described herein, and a current sensor for the filament current 104, and signal processor circuit.

In the preferred form of this embodiment, the anode current sensor 10 uses about 200 turns of #24 solid wire 12 to produce an exciting magnetic field, wherein the current range should be 1 mA to 2 amps. For very accurate low current measurements, a second sensor unit 10 could be added with even more turns of wire 12. For filament current in the range of 1 to 10 amperes, about 20 turns of #16 or 18 wire could be used for the exciting coil 12 in the common lead of the cathode.

In the preferred embodiment, the voltage divider 42 includes five sections of 20 meg ohm resistors 44, each in parallel with a 470 pf (picofarad) film capacitor 46. The product of 1/(2*pi*R*C )is the cross over frequency where the effect of the capacitor 46 dominates that of the resistors 44. This yields 16.9 Hz as RC cross over. The result is that any error in frequency compensation can produce a significant error in short exposures, or in single phase generators where the primary harmonic is 120 Hz.

Figure 7:
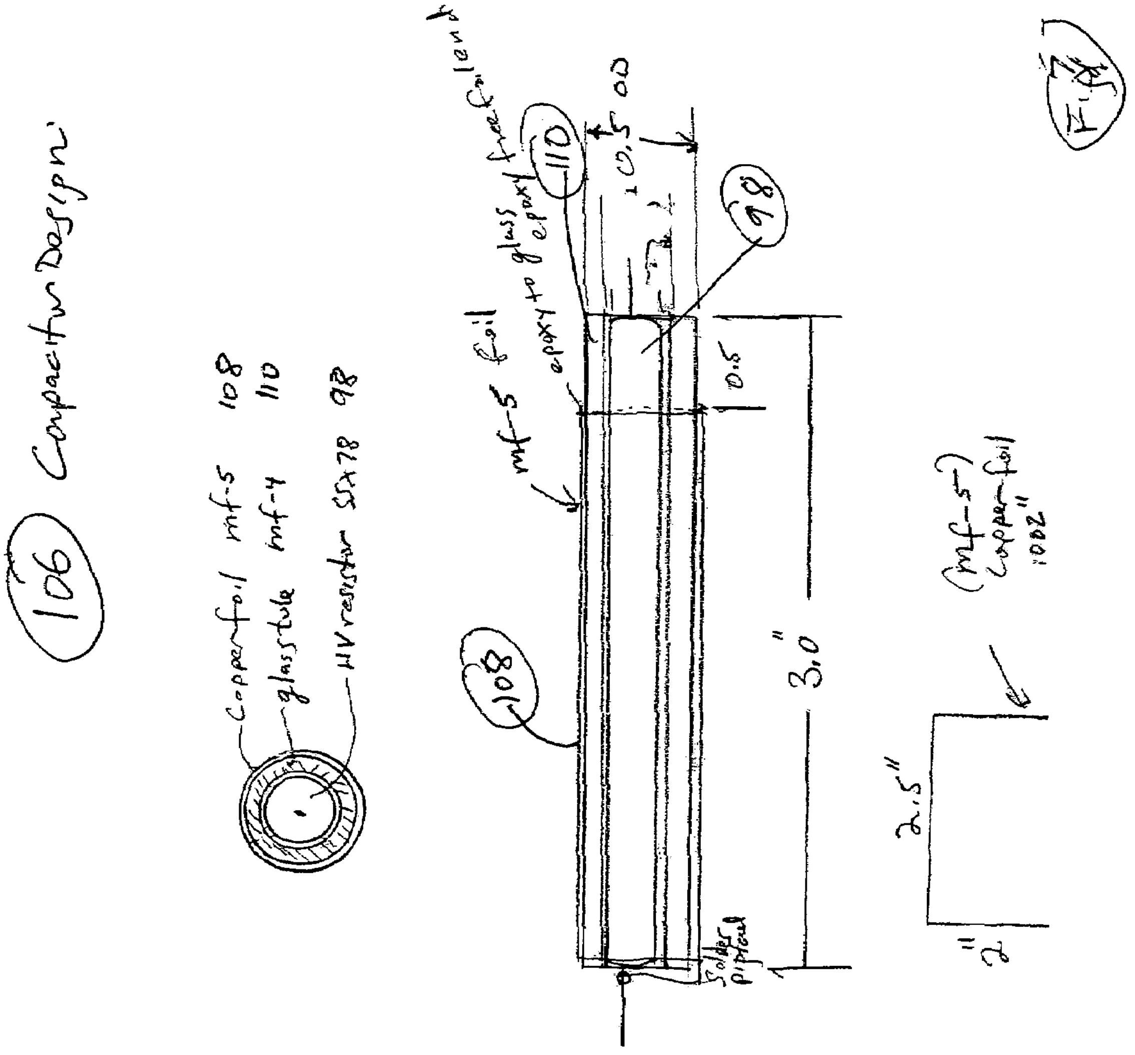
FIG. 7 is an electrical diagram showing the capacitor design used in the present invention.
Figure 8:
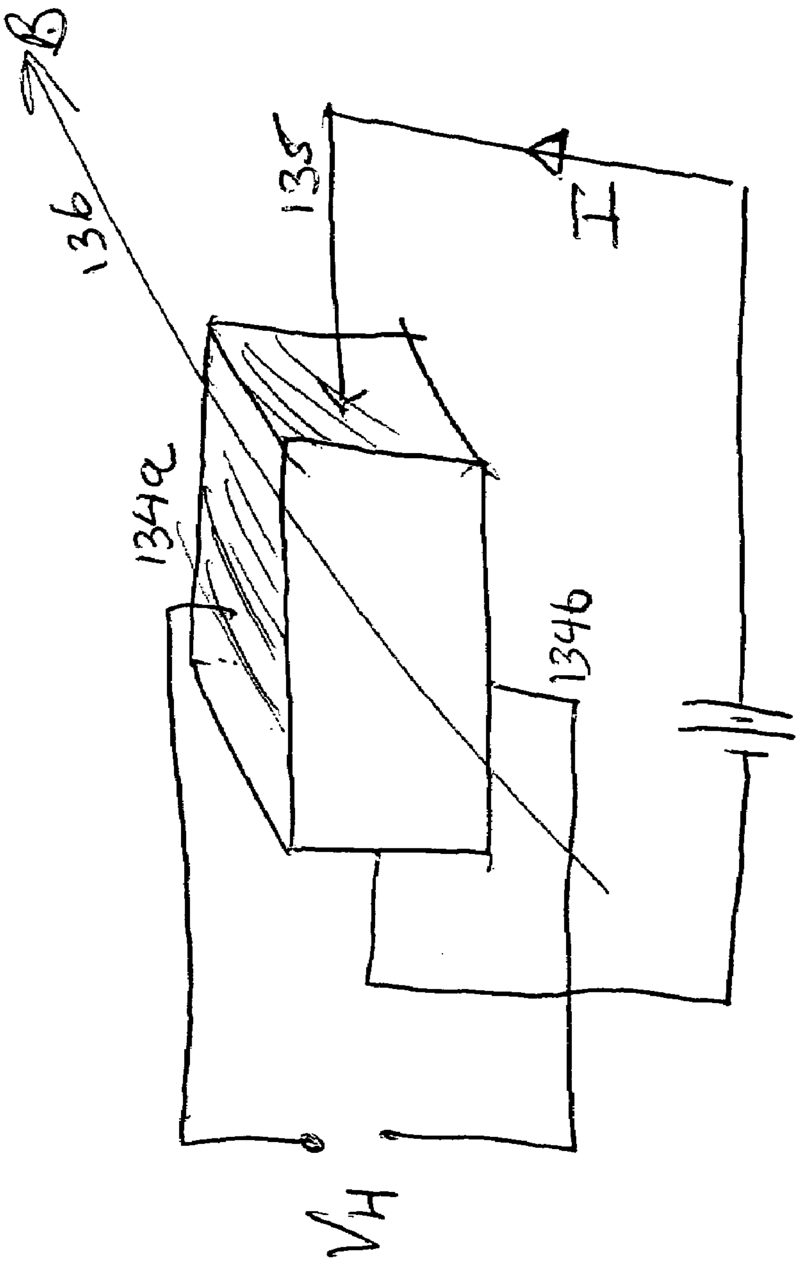
FIG. 8 is an electrical diagram of a Hall Effects current sensor as used in the present invention.

A solution would be to create a low value (less than 100 pf) capacitor 106 by epoxy gluing copper foil 108 to the outside of a piece of glass tubing 110, where the body of the resistor 112 is considered the other electrode 114, as shown in FIG. 7. This capacitor 106 acts over the distributed resistance. The high frequency components of the waveform would get "lost" in the long resistors 112 without compensation. The copper foil 108 is attached to the highest potential terminal of the high voltage resistor 44. The length of the foil 108 is such that sufficient clearance is provided to prevent flash over of the high voltage. Each resistor 44 operates at a maximum potential of 15000 volts, though they should be able to withstand overage to 25,000 volts short time.

To a first order, the temperature coefficient of the capacitor 106 due to radial changes is negligible, because analysis of it capacitance formula is $$C=2*pi*e**/(\ln(r2/r1))$$

where e is the dielectric permittivity

Or in practical units:

$C=7.354\ K/(\log 10\ D/d)$pf/ft

From these formulae C=55 pf, and cross over frequency is 144 Hz. Empirical evidence shows a lower value of effective capacitance due to the distribution.

In practical terms, there are few generators that actually exhibit rise times faster than 0.1 mS, and more likely 1 mS. A fast divider 42 is needed to accurately view ripple in high frequency controlled x-ray generators.

In operation, a trigger signal 116 is derived from the voltage divider 42 Kv signal. When the trigger signal exceeds a threshold level, a trigger pulse 118 is delivered to a timing circuit 120. The timing circuit 120 ensures that when the exposure is made a stable representation of the quiescent ("zero compensation") value of the mA signal is stored. It is assumed that the mA signal has a very low frequency drift due to changes in magnetic orientation of the unit 10, residual magnetic flux, and some thermal drift. By subtracting this value from the signal value when it is known to be active, a more accurate mA signal value is obtained. The timing and control section 120 assures that an "old" value of "zero" is stored for 2 milliseconds before it is dumped, when a new value is stored in the alternating memories 122. This can easily be done by either hard wired long, or by a microprocessor and a/d converters 92 and d/a converters 94. Two milliseconds is sufficient for the slowest rise time KV signal to reach approximately 5 kV as the trigger value. Thus, in the worst case scenario the internally clocked signal starts to store a new "zero" just as an exposure begins. Sensing this, it will use the older stored value. For the sake of argument, a new zero value is updated twice a second. A sufficiently large hold capacitor 124 is used with the analog sample and hold circuit 126 to minimize droop, at the expense of increased acquisition time.

Referring to FIG. 5, the operation of the current sensor 10 of the present invention is further illustrated. The output from the Hall Effect sensor 22 is connected to an operational amplifier 128 as well as to a timing and analog storage circuit block 130. A trigger signal is generated by the high voltage divider 42, which signal is the difference between the anode and cathode signals (as shown in FIG. 4), and is applied to comparator 74. A reference signal (Vref) is used, which reference signal is a DC value that is typically set at 2 percent of the full scale Kv signal, such that Vref=V+ *R24/(R23+R24), wherein R23 and R24 are resistors as illustrated in FIG. 5. The purpose of this circuit is to compensate for variations in the DC output of the Hall Sensor 22 caused by residual magnetism, the Earth's magnetic field, and thermal drifts. This circuit consists of means to store the average value of the Hall Sensor 22 signal before an exposure is made, either by an analog sample and hold circuit 64 (in FIG. 4), which are commercial integrated circuits coupled with low loss capacitors, or digitally by extensive logic or microprocessor means, such as by using A-D converters 92 and D-A converters 96 and computer memory, as shown in FIG. 5. Two overlapping values of "zero" are captured at different times, typically 50 milliseconds apart. When a trigger signal is present, the logic within the timing and analog storage block 130 will select the oldest stored value of zero, so as not to select a value that may have been captures slightly before the trigger signal is realized. The stored value is presented to the difference amplifier 132 and is subtracted from the present value of the signal.

The Hall Effect sensor 22 requires a bias current to produce an electric current flow across the semiconductor silicon piece (X axis). There are two electrodes 134 at right angles to this current flow to detect a shift in the direction of the current (Y axis). A magnetic field perpendicular to these two axes (Z axis) would cause a displacement of the current patch and generate a voltage. This design can use either a discrete Hall Effect sensor 22 or an integrated sensor, which is preferred.

In other alternative embodiments, two or more magnetic sections 16 may be used, separated by insulation 18, and stabilized by high voltage resistors 44. The sensor 10 could be built with 8 sections for measurement and incorporation with a 150 Kv oil filled voltage divider 42. In fact, there are few limits to the length of the sensor 10, except that the magnetic flux decreases with the addition of more sections, and there are practical limits to the number of turns or wire 12 applied as the signal source.

It would also be possible that the initial coil 12 be wound directly around one of the pieces of ferrite material 16 rather than the insulating tube 14. The insulating cylinder 14 could have a coil bobbin with the coil 12 pre-wound around it for easier assembly.

As an alternative form of insulation, SF6 gas may be used. Most other gasses have low ionization potentials and are therefore not suitable for insulation. Other gases, such as Krypton, may also be effective.

The electronic zero drift circuit 60 may be replaced with a digital version of the same, or with commercially available subsystems.

A larger system may be built with one or more of the current sensors 10 of the present invention, with different turn rations so as to be able to measure both Fluorscopic current of 0.1 to 14 mA, as well as higher currents of 10 to 2000 mA.

It should also be appreciated that a frequency compensated voltage divider 42 is not necessary if only DC is to be measured, or if measurement of all the voltage is not required.

The high voltage resistors 44 may be constructed with integrated frequency compensation capacitors by placing an insulating tube coaxially with the resistor 44. The outside of the glass tube may be wrapped with a metal foil or a metallic film may be applied by plasma spray or other similar method. The metal shield is attached to one end of the resistor 44, thereby providing a capacitance so that the fundamental principals of a compensated voltage divider be met, namely R1C1=R2C2, where R1 and C1 are the resistors connected to the source, and R2 and C2 are the "viewing resistors" attached to the lower level circuits. When multiple resistor and capacitor sections are used, the RnCn=R2C2 ratio is maintained.

Having thus described the invention with particular reference to the preferred forms thereof, it will be obvious that various changes and modifications can be made therein without departing from the spirit and scope of the present invention as defined by the appended claims.

I claim:

1. A sensor for measuring anode tube current or filament current in a high voltage device, said sensor comprising at least one coil of wire having at least one turn, said coil being wrapped around an insulating tube, wherein said insulating tube houses at two or more pieces of magnetic material separated by an insulating material, and further including a magnetic field sensor capable of measuring a static and alternating magnetic field.

2. The sensor of claim 1, wherein said coil of wire comprises approximately 200 turns of wire.

3. The sensor of claim 1, wherein said insulating tube is composed of plastic and has an inner diameter of between ¾ inch and ⅝ inch and an outer diameter of between ⅞ inch and 1 ¼ inch.

4. The sensor of claim 1, wherein said insulating tube houses four pieces of magnetic material and four pieces of insulating material.

5. The sensor of claim 1, wherein said insulating material comprises cup shaped members having a diameter of approximately 0.470 inch.

6. The sensor of claim 1, wherein said magnetic material comprises a ferrous substance and include electrical contacts.

7. The sensor of claim 1, wherein said magnetic sensor comprises a Hall Effects magnetic sensor.

8. The sensor of claim 7, wherein said Hall Effects magnetic sensor is insulated from said magnetic material.

9. The sensor of claim 1, wherein retaining springs are provided to maintain contact between said magnetic material, said insulating material and said magnetic sensor.

10. The sensor of claim 1, further including a power supply for providing power to said magnetic sensor.

11. The sensor of claim 10, wherein said power supply is +/−5 volts for the magnetic sensor.

12. The sensor of claim 1, wherein an electric field having electrical potentials and magnetic potentials is generated between said pieces of magnetic material, wherein at least one resister is provided to fix said electrical potentials and magnetic potentials and make uniform the electric field between said pieces of magnetic material.

* * * * *